United States Patent
Ito

(10) Patent No.: US 9,852,933 B2
(45) Date of Patent: Dec. 26, 2017

(54) SUBSTRATE PROCESSING APPARATUS, SUBSTRATE PROCESSING METHOD, AND RECORDING MEDIUM

(71) Applicant: Tokyo Electron Limited, Tokyo (JP)

(72) Inventor: Norihiro Ito, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/700,342

(22) Filed: Apr. 30, 2015

(65) Prior Publication Data
US 2015/0318192 A1 Nov. 5, 2015

(30) Foreign Application Priority Data

May 2, 2014 (JP) .................................. 2014-095218

(51) Int. Cl.
*H01L 21/67* (2006.01)
*H01L 21/306* (2006.01)
*H01L 21/687* (2006.01)

(52) U.S. Cl.
CPC .. *H01L 21/67253* (2013.01); *H01L 21/30604* (2013.01); *H01L 21/6708* (2013.01); *H01L 21/67109* (2013.01); *H01L 21/67248* (2013.01); *H01L 21/68764* (2013.01)

(58) Field of Classification Search
USPC ................. 156/345.52, 345.55; 118/725, 724
See application file for complete search history.

(56) References Cited

U.S. PATENT DOCUMENTS

| 6,001,183 | A | * | 12/1999 | Gurary | ................ | C23C 16/4584 |
| | | | | | | 118/720 |
| 6,902,623 | B2 | * | 6/2005 | Gurary | ................ | C23C 16/4401 |
| | | | | | | 118/504 |
| 7,479,205 | B2 | * | 1/2009 | Okuda | ...................... | B08B 1/04 |
| | | | | | | 134/113 |

(Continued)

FOREIGN PATENT DOCUMENTS

| JP | 2003115474 A | * | 4/2003 |
| JP | 2011-054932 A | | 3/2011 |

OTHER PUBLICATIONS

Machine Generated English Translation of JP 2003-115474. Published Apr. 18, 2003.*

*Primary Examiner* — Sylvia R MacArthur
(74) *Attorney, Agent, or Firm* — Pearne & Gordon LLP

(57) ABSTRACT

A heating processing performed on an outer peripheral portion of a substrate can be optimized. A substrate processing apparatus includes a holding unit configured to hold a substrate; a rotation unit configured to rotate the holding unit; a processing liquid supply unit configured to supply a processing liquid onto the substrate held in the holding unit; and a heating device configured to heat an outer peripheral portion of the substrate held in the holding unit. Further, the heating device includes a discharge flow path through which a gas is discharged toward the outer peripheral portion of the substrate held in the holding unit; a branch flow path through which a gas is discharged toward a region other than the substrate held in the holding unit; and a heating unit configured to heat the discharge flow path and the branch flow path.

12 Claims, 8 Drawing Sheets

(56) References Cited

U.S. PATENT DOCUMENTS

| | | | |
|---|---|---|---|
| 8,603,248 B2 * | 12/2013 | Gurary | C23C 16/4586 118/725 |
| 2006/0110143 A1 * | 5/2006 | Ito | H01L 21/67051 392/388 |
| 2011/0030737 A1 * | 2/2011 | Amano | H01L 21/67051 134/32 |
| 2011/0048468 A1 * | 3/2011 | Amano | H01L 21/67051 134/32 |
| 2011/0089137 A1 * | 4/2011 | Tanaka | H01L 21/02057 216/13 |
| 2013/0153116 A1 * | 6/2013 | Hirakawa | H01L 21/67092 156/64 |
| 2013/0171831 A1 * | 7/2013 | Namba | H01L 21/02087 438/748 |
| 2014/0020846 A1 * | 1/2014 | Hirakawa | H01L 21/67092 156/711 |
| 2014/0116480 A1 * | 5/2014 | Higashijima | H01L 21/67051 134/153 |
| 2014/0137902 A1 * | 5/2014 | Aiura | H01L 21/68735 134/95.2 |
| 2015/0138192 A1 * | 5/2015 | Marchenko | G06F 3/048 345/419 |

* cited by examiner

SUBSTRATE PROCESSING APPARATUS, SUBSTRATE PROCESSING METHOD, AND RECORDING MEDIUM

CROSS-REFERENCE TO RELATED APPLICATION

This application claims the benefit of Japanese Patent Application No. 2014-095218 filed on May 2, 2014, the disclosures of which are incorporated herein by reference.

TECHNICAL FIELD

The embodiments described herein pertain generally to a substrate processing apparatus, a substrate processing method, and a recording medium.

BACKGROUND

Conventionally, in a semiconductor device manufacturing process, a substrate such as a silicon wafer or a compound semiconductor wafer has been processed by supplying a processing liquid such as an etching liquid toward a central portion of the substrate from the above while rotating the substrate.

In some cases, the processing liquid such as an etching liquid may be heated to a predetermined temperature for efficiency of a substrate processing. However, after the processing liquid is heated to the predetermined temperature, the temperature of the processing liquid is decreased due to thermal conduction to the substrate until the processing liquid reaches an outer peripheral portion of the substrate after being supplied to the central portion of the substrate. That is, as being close to the outer peripheral portion of the substrate, the temperature of the processing liquid is decreased. As a result, there may be processing non-uniformity in processing caused by the processing liquid between at the central portion of the substrate and at the outer peripheral portion thereof.

In this regard, Patent Document 1 describes a technique of heating an outer peripheral portion of a substrate by supplying a high-temperature gas to the outer peripheral portion of the substrate. According to this technique, it is possible to suppress the temperature of the processing liquid from being decreased at the outer peripheral portion of the substrate by heating the outer peripheral portion of the substrate.

Patent Document 1: Japanese Patent Laid-open Publication No. 2011-054932

However, the technology described in Patent Document 1 needs to be further improved in order to optimize a heating processing on an outer peripheral portion of a substrate.

By way of example, there may be a case where a substrate is processed using an etching liquid heated to a predetermined temperature and rinsed with pure water and then, a substitution processing of substituting the pure water on the substrate with IPA (isopropyl alcohol) is performed. In such a series of substrate processings, if an outer peripheral portion of the substrate is continuously heated, volatilization of the IPA is promoted by heating, for example, during the substitution processing. Therefore, the pure water may not be sufficiently substituted with the IPA.

For this reason, the heating of the outer peripheral portion of the substrate, i.e., discharge of the high-temperature gas to the outer peripheral portion of the substrate, may be considered to be temporarily stopped. However, if the discharge of the high-temperature gas is stopped, when the discharge is restarted, it takes some time for a temperature of a gas to be discharged to reach the predetermined temperature. For this reason, it is necessary to wait for the starting of a next substrate processing with the etching liquid until a temperature of the gas reaches the predetermined temperature. Therefore, a throughput may be decreased.

SUMMARY

An exemplary embodiment provides a substrate processing apparatus, a substrate processing method which can optimize a heating processing on an outer peripheral portion of a substrate, and a recording medium.

According to an exemplary embodiment, a substrate processing apparatus includes a holding unit configured to hold a substrate; a rotation unit configured to rotate the holding unit; a processing liquid supply unit configured to supply a processing liquid onto the substrate held in the holding unit; and a heating device configured to heat an outer peripheral portion of the substrate held in the holding unit. Further, the heating device includes a discharge flow path through which a gas is discharged toward the outer peripheral portion of the substrate held in the holding unit; a branch flow path through which a gas is discharged toward a region other than the substrate held in the holding unit; and a heating unit configured to heat the discharge flow path and the branch flow path.

According to the exemplary embodiment, it is possible to optimize a heating processing on an outer peripheral portion of a substrate.

The foregoing summary is illustrative only and is not intended to be in any way limiting. In addition to the illustrative aspects, embodiments, and features described above, further aspects, embodiments, and features will become apparent by reference to the drawings and the following

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
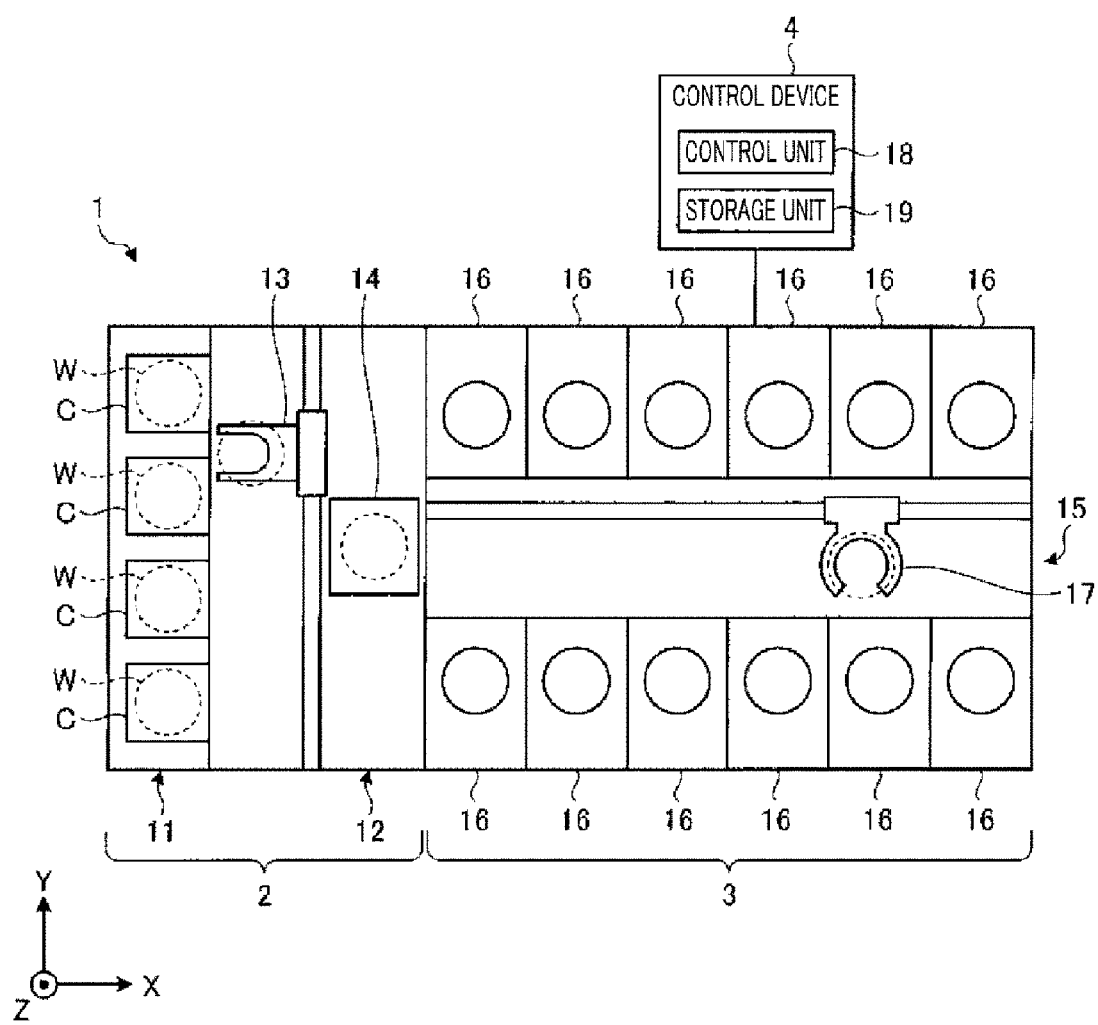
FIG. 1 is a plan view illustrating an outline of a substrate processing system according to an exemplary embodiment of the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following, a substrate processing apparatus, a substrate processing method, and a recording medium disclosed by the present disclosure will be described in detail with reference to the accompanying drawings. The present disclosure is not limited to the following exemplary embodiments.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
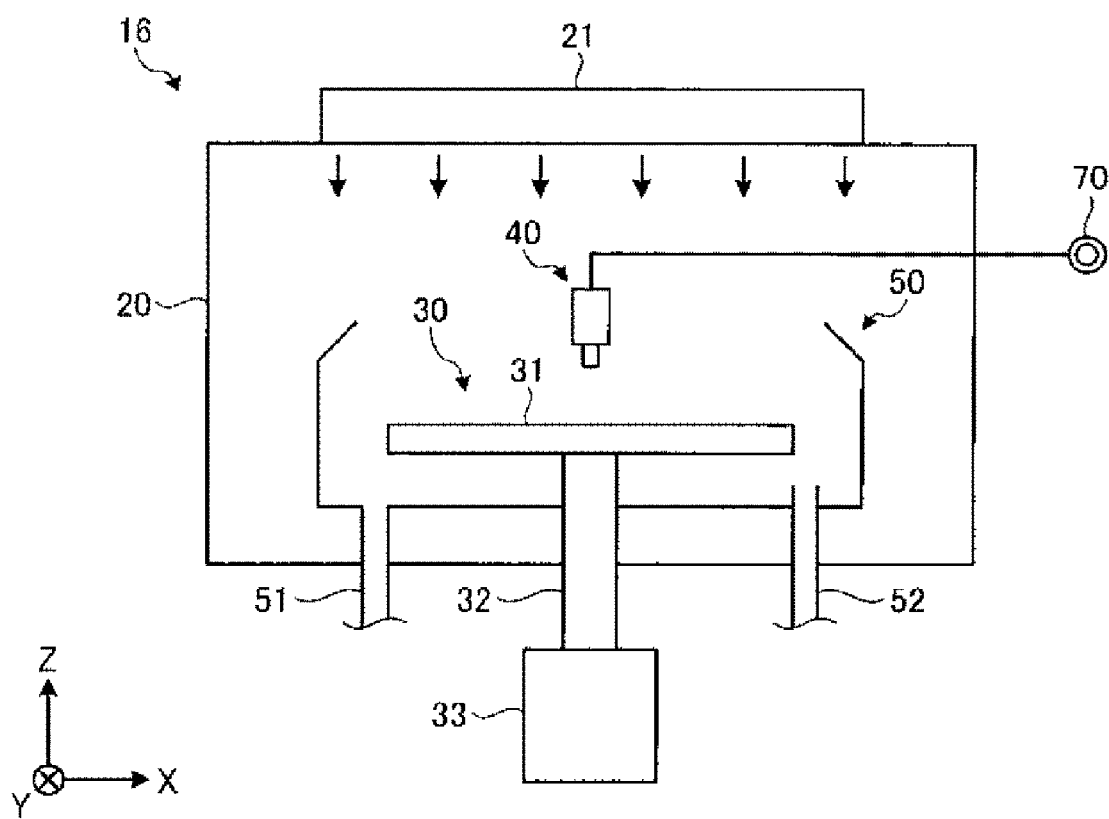
FIG. 2 is a diagram illustrating an outline of a processing unit.

Hereinafter, a configuration of the processing unit 16 will be described with reference to FIG. 2. FIG. 2 is a diagram illustrating an outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
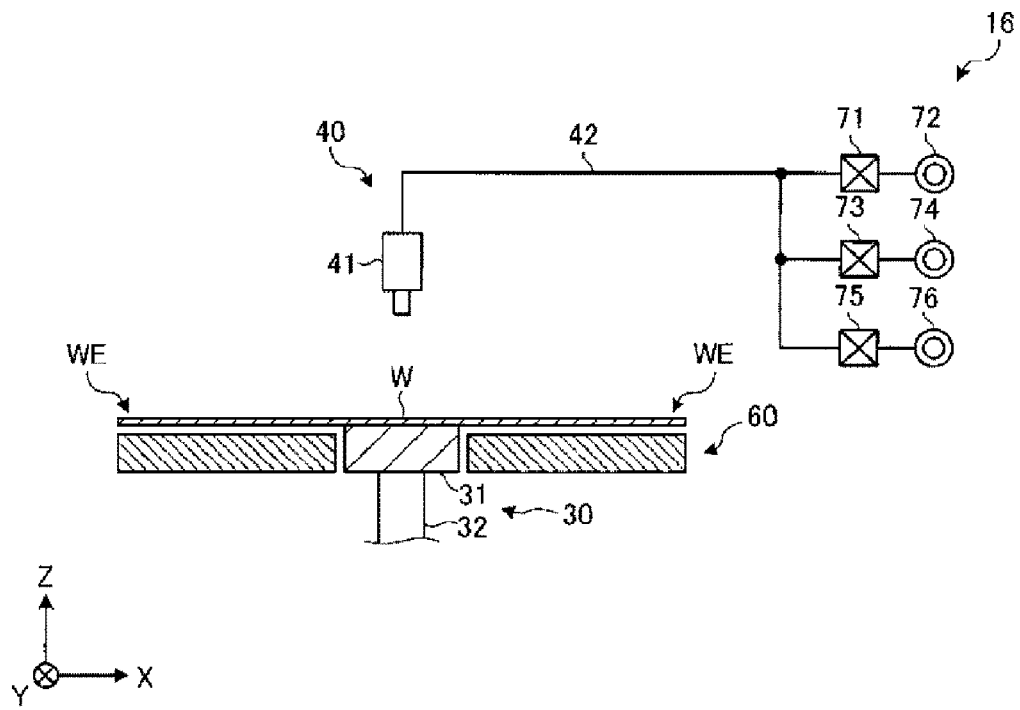
FIG. 3 is a diagram illustrating a specific configuration of the processing unit.

Hereinafter, a specific configuration of the processing unit 16 will be described with reference to FIG. 3. FIG. 3 is a diagram illustrating a specific configuration of the processing unit 16.

As illustrated in FIG. 3, the processing unit 16 is provided with a heating device 60. The heating device 60 heats an outer peripheral portion WE of the wafer W held in the holding unit 31 by discharging a high-temperature gas toward the outer peripheral portion WE of the wafer W. The heating device 60 is disposed at a rear surface side (opposite side to a processing target surface) of the wafer W.

The holding unit 31 is, for example, a vacuum chuck, and configured to attract and hold a rear central portion of the wafer W. That is, the rear surface of the wafer W is exposed except the central portion held in the holding unit 31, and the heating device 60 is disposed to face the exposed rear surface. The heating device 60 is arranged to have a gap of, for example, about 2 mm to about 3 mm with respect to the exposed rear surface of the wafer W.

The processing fluid supply unit 40 is provided with a nozzle 41 and a line 42. One end of the line 42 is connected to the nozzle 41, and the other end of the line 42 is branched into multiple lines respectively connected to a chemical liquid source 72 via a valve 71, a DIW source 74 via a valve 73, and an IPA source 76 via a valve 75. The processing fluid supply unit 40 discharges a chemical liquid supplied from the chemical liquid source 72, DIW (room-temperature pure water) supplied from the DIW source 74, or normal temperature IPA (isopropyl alcohol) supplied from the IPA source 76 toward a surface (processing target surface) of the wafer W through the nozzle 41.

Herein, there has been described an example where the processing fluid supply unit 40 is provided with the single nozzle 41. However, the processing fluid supply unit 40 may be provided with multiple nozzles respectively corresponding to various processing liquids. That is, the processing fluid supply unit 40 may be provided with a nozzle connected to the chemical liquid source 72 and configured to discharge the chemical liquid, a nozzle connected to the DIW source 74 and configured to discharge the DIW, and a nozzle connected to the IPA source 76 and configured to discharge the IPA. Further, the processing fluid supply unit 40 may be connected to a volatile solvent source, instead of the IPA source 76, configured to supply a volatile solvent other than the IPA to the nozzle 41.

Figure 4:
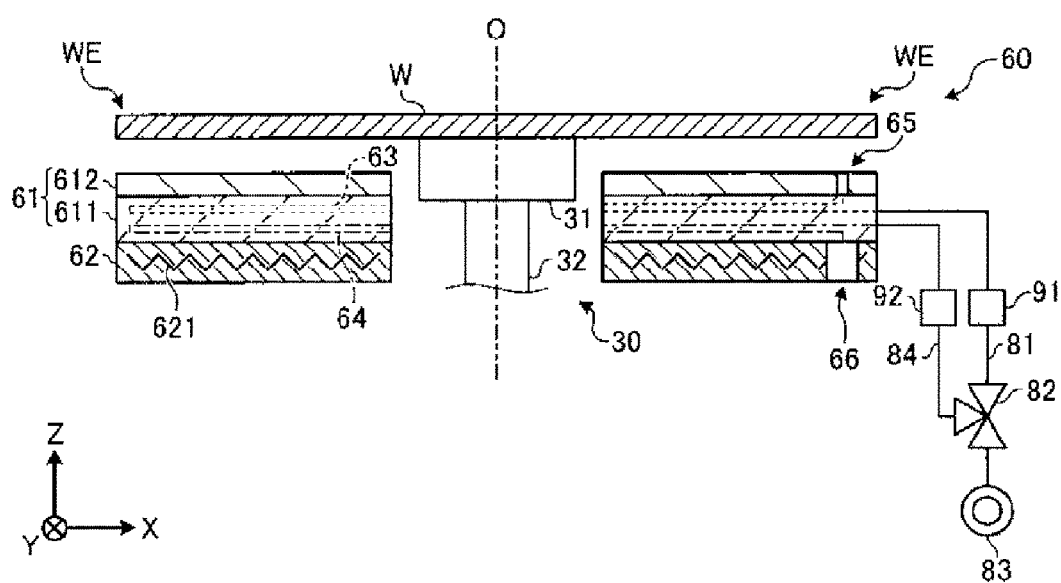
FIG. 4 is a diagram illustrating a configuration of a heating device.

Hereinafter, a specific configuration of the heating device 60 will be descried with reference to FIG. 4. FIG. 4 is a diagram illustrating a configuration example of the heating device 60. A symbol "O" in FIG. 4 represents a center line of the wafer W.

As illustrated in FIG. 4, the heating device 60 is provided with a facing plate 61 and a heating unit 62. The facing plate 61 is provided to face the rear surface of the wafer W, and the heating unit 62 is provided on a surface of the facing plate 61, which is opposite to a facing surface of the facing plate 61 facing the wafer W.

The facing plate 61 includes a discharge flow path 63 through which a gas is discharged toward the outer peripheral portion WE of the wafer W held in the holding unit 31; and a branch flow path 64 through which a gas is discharged toward a region other than the wafer W. The discharge flow path 63 communicates with a first discharge opening 65 formed in a sealing member 612, and the branch flow path 64 communicates with a second discharge opening 66 formed in the heating unit 62.

The discharge flow path 63 and the branch flow path 64 are connected to a switching valve 82 via branch lines 81 and 84, respectively. The switching valve 82 is connected to a gas source 83.

A first flow rate control unit 91 configured to control a flow rate of a gas flowing through the discharge flow path 63 is provided at the branch line 81. Further, a second flow rate control unit 92 configured to control a flow rate of a gas flowing through the branch flow path 64 is provided at the branch line 84. The first flow rate control unit 91 and the second flow rate control unit 92 are, for example, mass flow controllers.

The switching valve 82 (corresponding to an example of "switching unit") is controlled by the control unit 18, and switches a supply destination of the gas supplied from the gas source 83 between the discharge flow path 63 and the branch flow path 64. The gas source 83 supplies a normal temperature gas such as a normal temperature $N_2$ gas or normal temperature dry air.

The heating unit 62 includes a heater 621 therein, and is configured to heat the discharge flow path 63 and the branch flow path 64 by using the heater 621. By allowing the normal temperature gas to flow through the heated discharge flow path 63 and branch flow path 64, the normal temperature gas can be heated to have a predetermined temperature.

The facing plate 61 includes a groove-shaped member 611 and the sealing member 612. The sealing member 612 is disposed to face the wafer W held in the holding unit 31, and the groove-shaped member 611 is provided on a surface of the sealing member 612, which is opposite to a surface of the sealing member 612 facing the wafer W.

Figure 5:
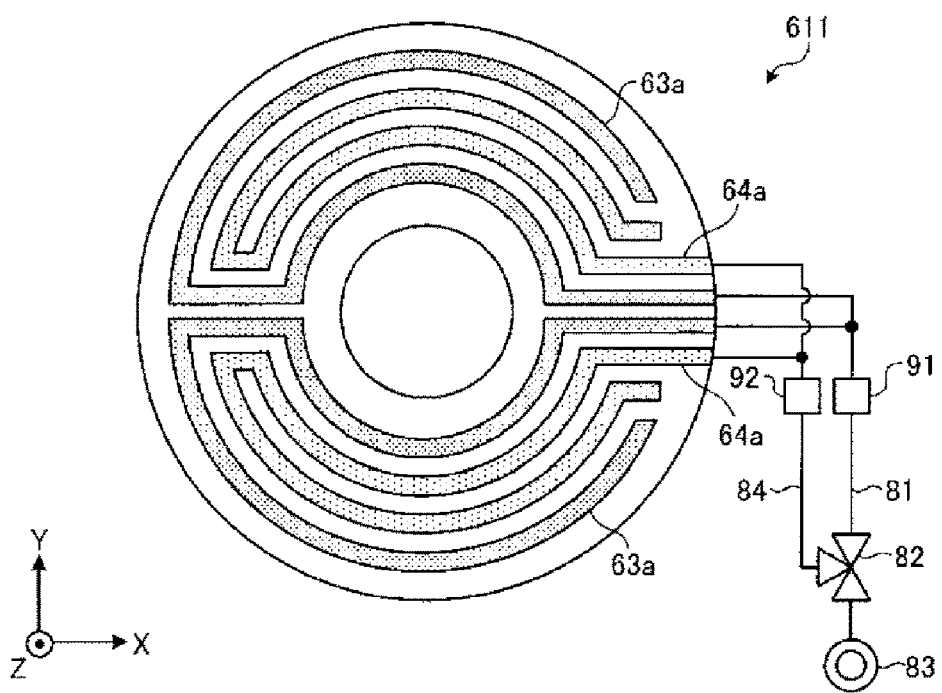
FIG. 5 is a diagram illustrating a configuration of a groove-shaped member.

Hereinafter, a specific configuration of the groove-shaped member 611 and the sealing member 612 will be described with reference to FIG. 5 and FIG. 6. FIG. 5 is a diagram illustrating a configuration of the groove-shaped member 611. Further, FIG. 6 is a diagram illustrating a configuration of the sealing member 612.

Figure 6:
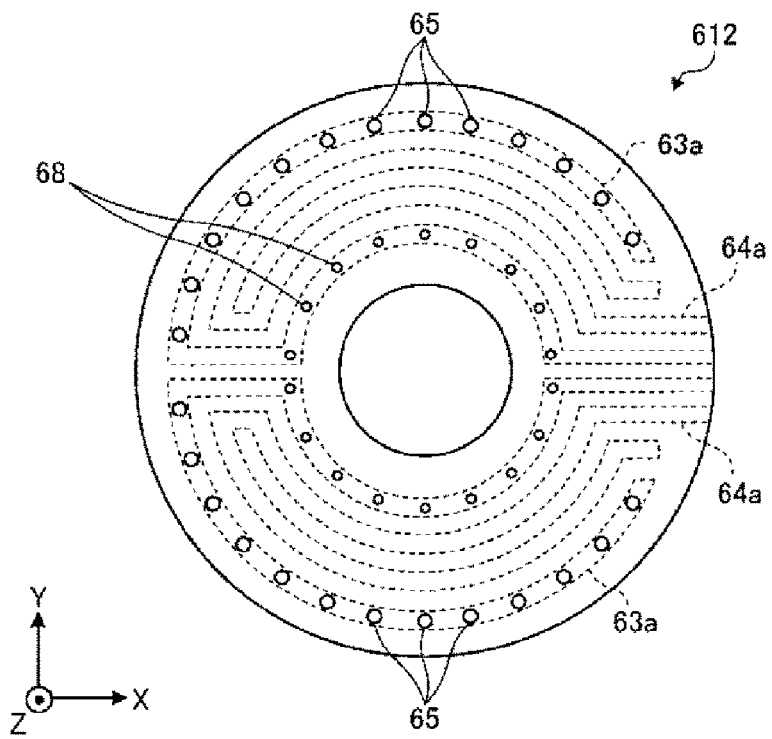
FIG. 6 is a diagram illustrating a configuration of a sealing member.

As illustrated in FIG. 5 and FIG. 6, the groove-shaped member 611 and the sealing member 612 are circular plate-shaped members each having substantially the same diameter as the wafer W. At a central portion of each of the groove-shaped member 611 and the sealing member 612, a circular hole having a diameter greater than the holding unit 31 is formed. Further, the heating device 60 is placed at a position where the center of the circular hole formed in the groove-shaped member 611 and the sealing member 612 is aligned with the center line O (see FIG. 4) of the wafer W.

As illustrated in FIG. 5, a groove 63a constituting a part of the discharge flow path 63 and a groove 64a constituting a part of the branch flow path 64 are formed on a surface of the groove-shaped member 611. Each of the groove 63a and the groove 64a is formed to detour the circular hole formed at the central portion of the groove-shaped member 611 from one end of the groove-shaped member 611 connected to the branch lines 81 and 84 to the other end thereof and also formed to pass along an outer periphery of the groove-shaped member 611 and return back to the one end thereof. Further, the groove 63a and the groove 64a are formed not to interfere with each other. To be specific, in the present exemplary embodiment, an outgoing path and an incoming path of the groove 64a are formed between an outgoing path and an incoming path of the groove 63a. These grooves 63a and 64a are sealed by the sealing member 612, so that the discharge flow path 63 and the branch flow path 64 are formed.

Further, the groove 63a and the groove 64a are formed in each of an area of the groove-shaped member 611 in a positive Y-axis direction and an area thereof in a negative Y-axis direction. Furthermore, the branch lines 81 and 84 are respectively connected to the grooves 63a and 64a formed in the area of the groove-shaped member 611 in the positive Y-axis direction and the grooves 63a and 64a formed in the area thereof in the negative Y-axis direction thereof.

As illustrated in FIG. 6, in the sealing member 612, multiple first discharge openings 65 are formed along an outer peripheral portion of the sealing member 612. The first discharge openings 65 are formed at positions corresponding to the incoming path of the groove 63a in the groove-shaped member 611, and a gas supplied from the gas source 83 to the discharge flow path 63 is discharged toward the outer peripheral portion WE of the wafer W through the first discharge openings 65.

The second discharge opening 66 (see FIG. 4) formed in the heating unit 62 is formed at a position corresponding to the groove 64a in the groove-shaped member 611, and the single second discharge opening 66 is formed in the single branch flow path 64 at the furthermost position from the gas source 83. As described above, the dual branch flow path 64 is formed in the facing plate 61. For this reason, two second discharge openings 66 in total are formed in the groove-shaped member 611.

A gas supplied from the gas source 83 to the branch flow path 64 is discharged toward the below of the heating device 60 through the second discharge openings 66.

As such, the heating device 60 heats the discharge flow path 63 and the branch flow path 64 formed in the facing plate 61 by using the heating unit 62; allows a normal temperature gas to flow through the heated discharge flow path 63 or branch flow path 64 to heat the normal temperature gas to a predetermined temperature; and discharges the heated gas toward the outer peripheral portion WE of the wafer W through the first discharge openings 65. Otherwise, the heating device 60 may discharge the heated gas toward a region other than the wafer W through the second discharge openings 66.

Further, the heating device 60 switches a supply destination of the gas supplied from the gas source 83 between the discharge flow path 63 and the branch flow path 64 by using the switch valve 82. Thus, the heating device 60 may switch the supply destination of the gas heated to the predetermined temperature into any one of the outer peripheral portion WE of the wafer W or the region other than the wafer W.

Furthermore, third discharge openings 68 are formed in the sealing member 612. The third discharge openings 68 are formed at positions corresponding to the outgoing path of the groove 63a in the groove-shaped member 611. The gas supplied from the gas source 83 to the discharge flow path 63 is discharged toward a central portion rather than the outer peripheral portion WE of the wafer W through the third discharge openings 68. Thus, it is possible to suppress the temperature of the chemical liquid from being decreased at the central portion of the wafer W as well as the outer peripheral portion WE of the wafer W.

The third discharge opening 68 is formed to have a diameter smaller than the first discharge opening 65. This is because a decrease amount of the temperature of the chemical liquid is smaller at the central portion of the wafer W than at the outer peripheral portion WE of the wafer W, and, thus, it is possible to suppress the temperature of the chemical liquid from being decreased with a flow rate lower than a flow rate of the gas discharged to the outer peripheral portion WE of the wafer W.

Further, as illustrated in FIG. 4, the second discharge opening 66 is formed to have a diameter greater than the first discharge opening 65 in order to set a gas flow rate in the discharge flow path 63 to be substantially equal to a gas flow rate in the branch flow path 64 as described below.

That is, the discharge flow path 63 communicates with the multiple first discharge openings 65 and third discharge openings 68, whereas the branch flow path 64 communicates with only one second discharge opening 66. For this reason, if the second discharge opening 66 has the same diameter as the first discharge opening 65 or the third discharge opening 68, it is difficult to allow a gas to flow through the branch flow path 64 at an equivalent flow rate to the flow rate in the discharge flow path 63. In other words, it is difficult to set the flow rates in the both flow paths to be substantially equal to each other without reducing the flow rate of the gas flowing through the discharge flow path 63. Therefore, in the heating device 60 according to the present exemplary embodiment, the second discharge opening 66 is formed to have a diameter greater than the first discharge opening 65, so that a gas can flow through the branch flow path 64 at the equivalent flow rate to the flow rate in the discharge flow path 63.

As such, by setting the gas flow rate in the discharge flow path 63 to be equal to the gas flow rate in the branch flow path 64, it is possible to suppress the output of the heater 621 from being changed when a gas supply destination is switched. Therefore, for example, when a gas supply destination is switched from the branch flow path 64 to the discharge flow path 63 during a chemical liquid processing to be described below, a gas heated to a predetermined temperature can be promptly discharged toward the wafer W.

Figure 7:
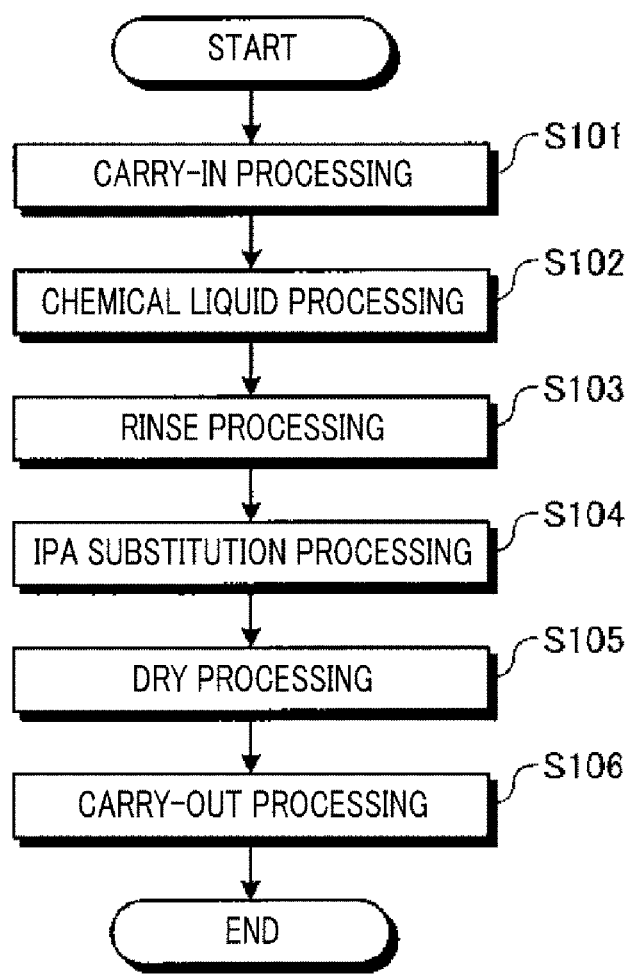
FIG. 7 is a flowchart illustrating a sequence of a substrate processing.
Figure 8:
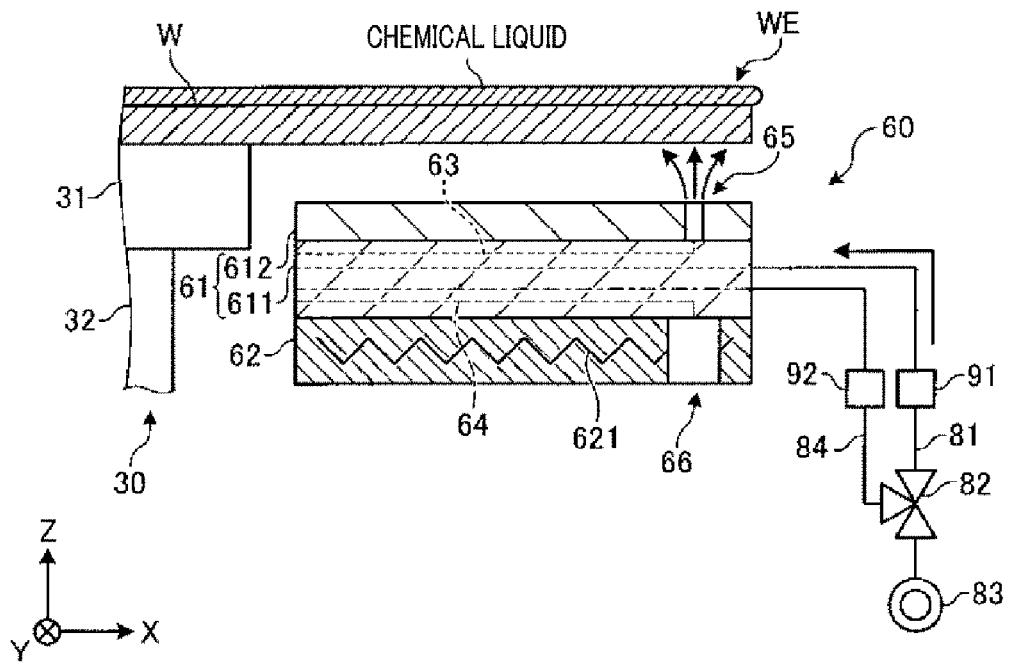
FIG. 8 is a diagram illustrating an operation example of a chemical liquid processing.
Figure 9:
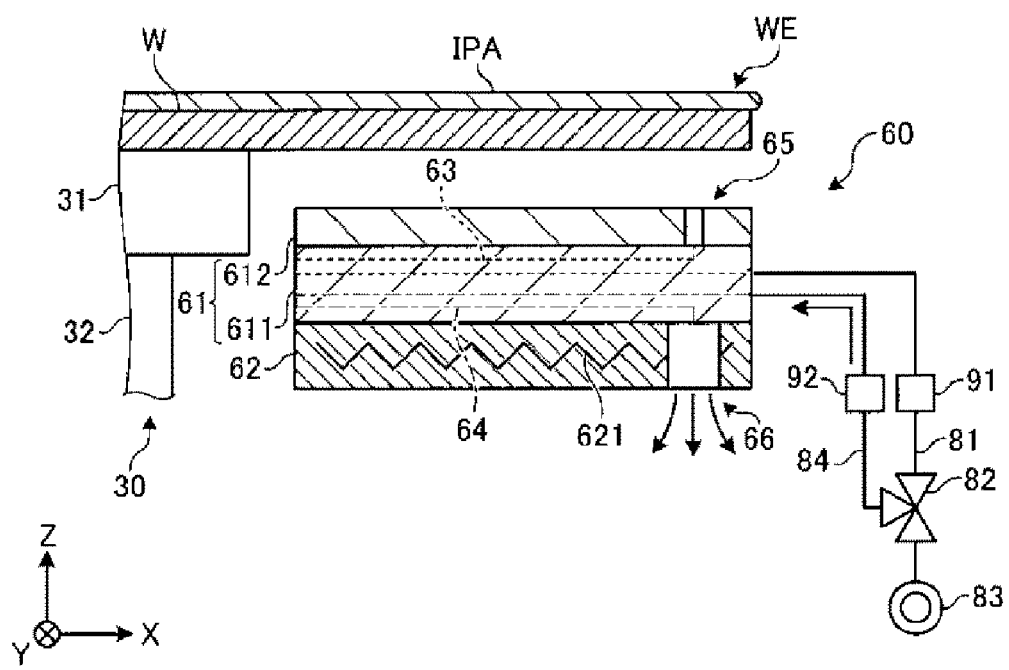
FIG. 9 is a diagram illustrating an operation example of an IPA substitution processing.

Hereinafter, a sequence of a substrate processing performed by the processing unit 16 will be described with reference to FIG. 7 to FIG. 9. FIG. 7 is a flowchart illustrating a sequence of a substrate processing. Further, FIG. 8 is a diagram illustrating an operation example of a chemical liquid processing, and FIG. 9 is a diagram illustrating an operation example of an IPA substitution processing.

Further, the processing unit 16 is controlled by the control unit 18 provided in the control device 4. The control unit 18 is, for example, a CPU (Central Processing Unit), and controls an operation of the processing unit 16 by reading and executing a non-illustrated program stored in the storage unit 19. Further, the control unit 18 may be formed of hardware only without using a program.

Herein, in a series of substrate processings in processes S101 to S106 as illustrated in FIG. 7, the discharge flow path 63 and the branch flow path 64 are maintained in a heated state by the heating unit 62. That is, the operation of the heating unit 62 is not stopped during the series of substrate processings. Further, in the series of substrate processings in the processes S101 to S106, a gas is continuously supplied into the discharge flow path 63 or the branch flow path 64 from the gas source 83. That is, the gas supply into the discharge flow path 63 or the branch flow path 64 from the gas source 83 is not stopped during the series of substrate processings.

At a start point of the series of substrate processings, the gas supplied from the gas source 83 is supplied into the branch flow path 64. That is, at the start point of the series of substrate processings, the heating device 60 discharges a gas heated to a predetermined temperature toward the below of the heating device 60 through the second discharge opening 66.

As illustrated in FIG. 7, in the processing unit 16, a carry-in processing of the wafer W is performed (process S101 (carry-in processing)). In the carry-in processing, the substrate transfer device 17 (see FIG. 1) places the wafer W on the holding unit 31, and the holding unit 31 attracts and holds the wafer W.

Then, in the processing unit 16, a chemical liquid processing is performed (process S102 (chemical liquid processing)). In the chemical liquid processing, the driving unit 33 rotates the holding unit 31, so that the wafer W held in the holding unit 31 is rotated at a predetermined rotation number. Then, the nozzle 41 of the processing fluid supply unit 40 is positioned above the central portion of the wafer W. Then, the valve 71 is opened for a predetermined time period, and a chemical liquid is supplied from the chemical liquid source 72 onto the processing target surface of the wafer W through the nozzle 41. The chemical liquid supplied to the wafer W is diffused to the entire processing target surface of the wafer W due to the centrifugal force caused by the rotation of the wafer W. Thus, the processing target surface of the wafer W is processed with the chemical liquid.

Herein, in the processing unit 16, as the chemical liquid processing in the process S102, there is performed an etching processing in which the processing target surface of the wafer W is etched by supplying an etching liquid such as HF (hydrofluoric acid) onto the processing target surface of the wafer W.

In the etching processing, the etching liquid heated to, for example, about 50° C. to about 80° C. is used to increase an etching rate. However, the etching liquid supplied to the central portion of the wafer W loses heat to the wafer W as it reaches the outer peripheral portion of the wafer W, and, thus, the temperature thereof is decreased. For this reason, there may be non-uniformity of the etching rate between at the central portion of the wafer W and at the outer peripheral portion thereof.

Therefore, in the processing unit 16 according to the present exemplary embodiment, there is performed a first discharge processing in which the outer peripheral portion WE of the wafer W is heated by discharging a gas heated to a predetermined temperature through the first discharge openings 65 of the heating device 60 during the chemical liquid processing.

To be specific, as illustrated in FIG. 8, for example, after the wafer W is held in the holding unit 31 and before the chemical liquid is supplied to the wafer W through the nozzle 41, a supply destination of the gas supplied from the gas source 83 is switched from the branch flow path 64 into the discharge flow path 63 by controlling the gas source 83. Thus, the normal temperature gas supplied from the gas source 83 is supplied to the discharge flow path 63 and heated to have an approximately equivalent temperature (50° C. to 80° C.) to a temperature of the etching liquid by the heating unit 62 while flowing through the discharge flow path 63. The heated gas is discharged from the first discharge openings 65 toward the outer peripheral portion WE of the wafer W. Thus, the outer peripheral portion WE of the wafer W is heated.

As such, by heating the outer peripheral portion WE of the wafer W, it is possible to suppress the temperature of the chemical liquid from being decreased at the outer peripheral portion WE of the wafer W. Therefore, it is possible to increase the etching rate uniformity on the entire surface thereof.

Herein, the control unit 18 controls the first flow rate control unit 91 and the second flow rate control unit 92 to allow a gas flow rate in the discharge flow path 63 to be equivalent to a gas flow rate in the branch flow path 64 in the series of substrate processings. Thus, as described above, it is possible to suppress the output of the heater 621 from being changed when the gas supply destination is switched. Further, the gas flow rate in the discharge flow path 63 is not necessarily equal to the gas flow rate in the branch flow path 64. That is, the control unit 18 may control the gas flow rate in the branch flow path 64 to be slightly lower than the gas flow rate in the discharge flow path 63 in a range where there is no change in temperature caused by switching the gas supply destination. Thus, it is possible to reduce an amount of gas consumption.

Although illustration is omitted, the heating device 60 also discharges a high-temperature gas to the central portion of the wafer W through the third discharge openings 68 as well as the outer peripheral portion WE of the wafer W during the first discharge processing. Thus, it is possible to suppress the temperature of the chemical liquid from being decreased at the central portion of the wafer W rather than the outer peripheral portion WE thereof.

Then, in the processing unit 16, there is performed a rinse processing of in which the processing target surface to be processed of the wafer W is cleaned with DIW (process S103 (rinse processing)). In the rinse processing, since the valve 73 is opened for a predetermined time period, the DIW supplied from the DIW source 74 is supplied to the processing target surface of the wafer W through the nozzle 41 and the chemical liquid remaining on the wafer W is cleaned.

Then, in the processing unit 16, there is performed an IPA substitution processing (process S104 (IPA substitution processing)). The IPA substitution processing is a process of substituting the DIW remaining on the processing target surface of the wafer W with IPA having a higher volatility than the DIW after the rinse processing is ended.

In the IPA substitution processing, since the valve 75 is opened for a predetermined time period, the IPA supplied from the IPA source 76 is supplied to the processing target surface of the wafer W through the nozzle 41. The IPA supplied to the wafer W is diffused to the entire processing target surface of the wafer W due to the centrifugal force caused by the rotation of the wafer W. Thus, the DIW remaining on the processing target surface of the wafer W is substituted with the IPA.

Then, in the processing unit 16, there is performed a dry processing (process S105 (dry processing)). In the dry processing, the IPA on the wafer W is removed by increasing a rotation number of the wafer W and the wafer W is dried. Thereafter, in the processing unit 16, a carry-out processing of the wafer W is performed (process S106 (carry-out processing)). In the carry-out processing, after the rotation of the wafer W by the driving unit 33 is stopped, the wafer W is carried out from the processing unit 16 by the substrate transfer device 17 (see FIG. 1). If the carry-out processing is completed, the series of substrate processings on a single wafer W is completed.

In the series of substrate processings in the processes S101 to S106, if the high-temperature gas is continuously supplied to the outer peripheral portion WE of the wafer W through the first discharge openings 65 of the heating device 60, for example, in the IPA substitution processing in the process S104, volatilization of the IPA is excessively promoted more than necessary. Therefore, the DIW may not be sufficiently substituted with the IPA. Further, since the IPA is heated with the high-temperature gas, it may be ignited.

Therefore, for example, if any processing other than the chemical liquid processing in the process S102 is performed, it may be considered to stop the heating by the heating unit 62 and the gas supply from the gas source 83. However, when the heating by the heating unit 62 is restarted, it takes some time for the output of the heater 621 to be stabilized. For this reason, it is necessary to wait for the starting of the chemical liquid processing until the gas having a predetermined temperature is discharged through the first discharge openings 65. Therefore, a throughput may be decreased.

Further, it may be considered to stop only the gas supply from the gas source 83 without stopping the heating by the heating unit 62. However, in this case, the heater 621 is heated in an empty state, and, thus, the heater 621 may be burned out by overheating. Further, even if the heater 621 has a function of automatically controlling an output thereof according to a target temperature, while the gas supply is stopped, the output thereof is suppressed to be low. As a result, when the gas supply is restarted, it may take some time for the output of the heater 621 to be stabilized. As such, it is not desirable to temporarily stop the heating by the heating unit 62 or the gas supply from the gas source 83 in view of promoting the efficiency in the series of substrate processings.

Therefore, in the processing unit 16 according to the present exemplary embodiment, the supply destination of the gas supplied from the gas source 83 is switched from the discharge flow path 63 into the branch flow path 64 instead of stopping the heating by the heating unit 62 and the gas supply from the gas source 83.

To be specific, after the chemical liquid processing in the process S102 is ended, the control unit 18 controls the switching valve 82 to perform a second discharge processing in which the supply destination of the gas supplied from the gas source 83 is switched from the discharge flow path into the branch flow path. Thus, as illustrated in FIG. 9, the gas supplied form the gas source 83 is supplied to the branch flow path 64 through the switching valve 82 and the branch line 84; heated by the heating unit 62 while flowing through the branch flow path 64 and then discharged to the below of the heating device 60, i.e., to a region other than the wafer W, through the second discharge openings 66. Therefore, it is possible to suppress the IPA supplied onto the wafer W from being heated with the high-temperature gas, for example, during the IPA substitution processing.

Further, the second discharge processing, i.e., the process in which the gas is discharged from the branch flow path 64 to the region other than the wafer W, may be performed, for example, only during the IPA substitution processing.

As described above, the processing unit 16 (corresponding to an example of "substrate processing device") according to the present exemplary embodiment is provided with the holding unit 31, the driving unit 33 (corresponding to an example of "rotation unit"), the processing fluid supply unit 40 (corresponding to an example of "processing liquid supply unit"), and the heating device 60. The holding unit 31 holds the wafer W. The driving unit 33 rotates the holding unit 31. The processing fluid supply unit 40 supplies a chemical liquid (corresponding to an example "processing liquid") heated to a predetermined temperature to the wafer W held in the holding unit 31. The heating device 60 heats the outer peripheral portion WE of the wafer W held in the holding unit 31.

Further, the heating device 60 is provided with the discharge flow path 63, the branch flow path 64, and the heating unit 62. The discharge flow path 63 is a flow path through which a gas is discharged toward the outer peripheral portion WE of the wafer W held in the holding unit 31. The branch flow path 64 is a flow path through which a gas is discharged toward a region other than the wafer W held in the holding unit 31. The heating unit 62 heats the discharge flow path 63 and the branch flow path 64.

Thus, it is possible to suppress the IPA supplied to the wafer W from being heated with the high-temperature gas during the IPA substitution processing without stopping the heating by the heating unit 62 and the gas supply from the gas source 83. Therefore, the processing unit 16 according to the present exemplary embodiment can efficiently perform the heating processing to the outer peripheral portion WE of the wafer W.

(Other Exemplary Embodiments)

Figure 10:
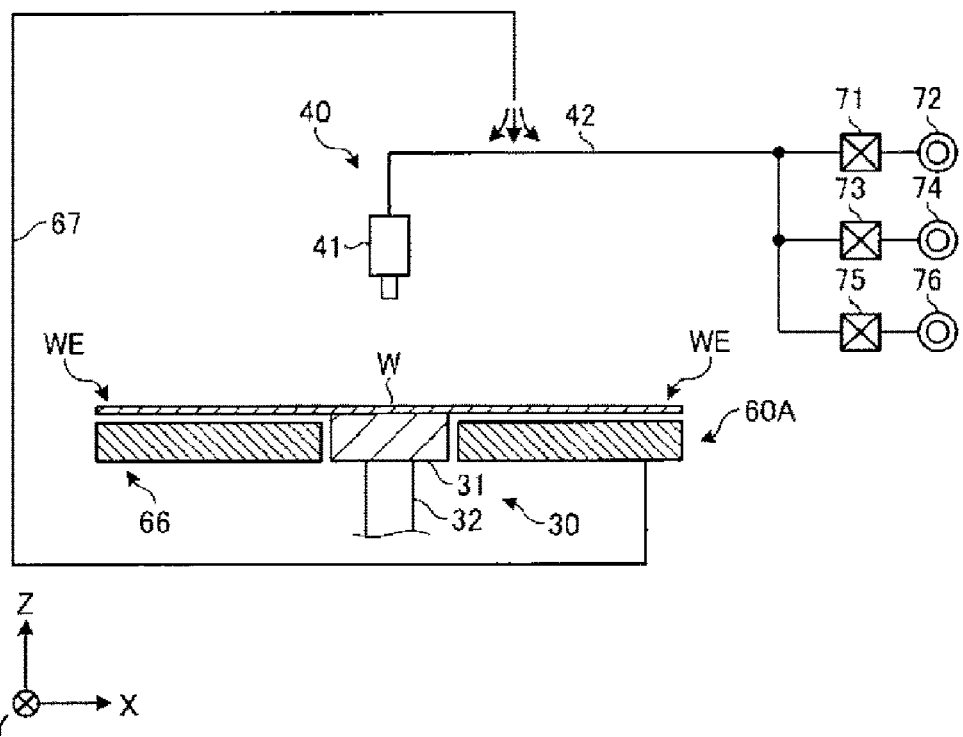
FIG. 10 is a diagram illustrating a configuration of a heating device according to a first modification example.
Figure 11:
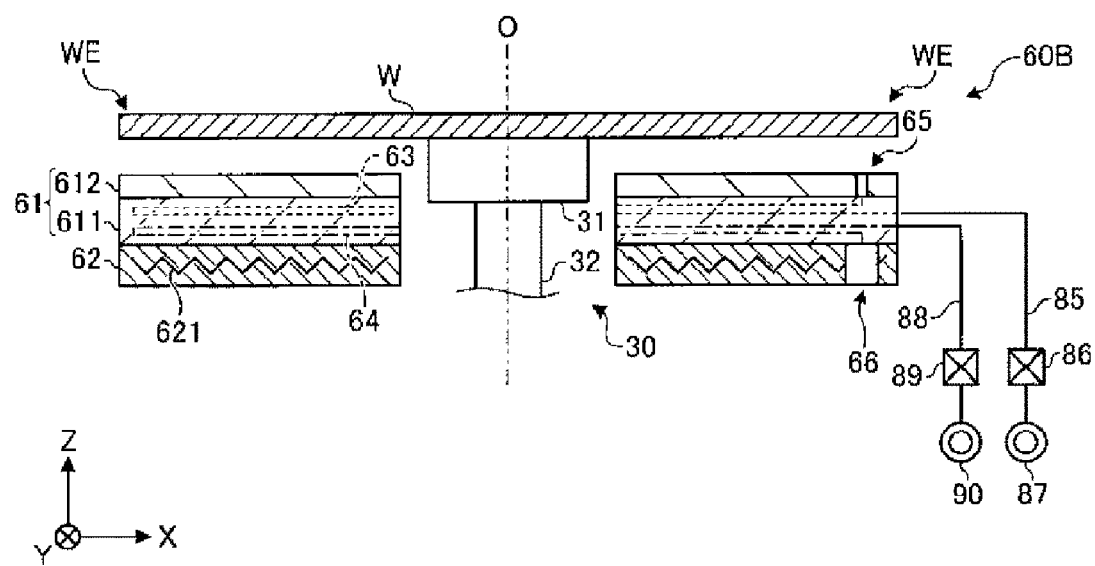
FIG. 11 is a diagram illustrating a configuration of a heating device according to a second modification example.
Figure 12:
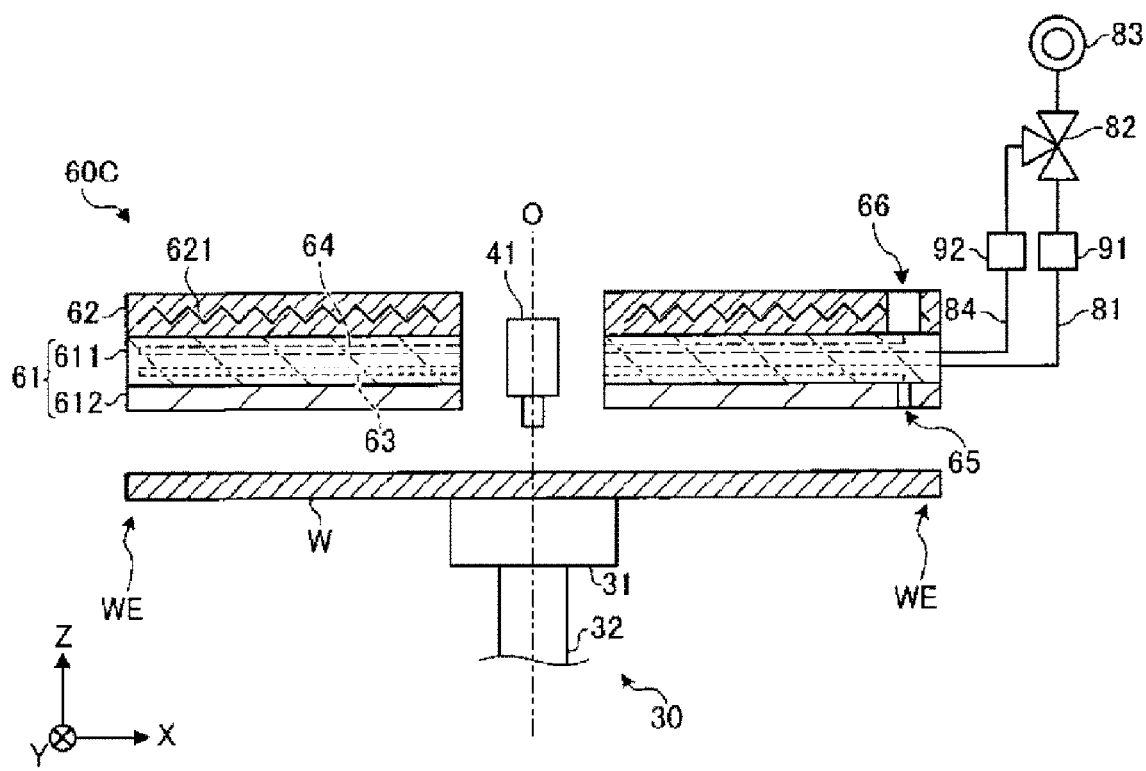
FIG. 12 is a diagram illustrating a configuration of a heating device according to a third modification example.

A configuration of the heating device is not limited to the configuration illustrated in the above-described exemplary embodiment. In the following, modification examples of the heating device will be described with reference to FIG. 10 to FIG. 12. FIG. 10 is a diagram illustrating a configuration of the heating device according to a first modification example, FIG. 11 is a diagram illustrating a configuration of the heating device according to a second modification example, and FIG. 12 is a diagram illustrating a configuration of the heating device according to a third modification example.

Further, in the following, the same components as described above will be assigned the same reference numerals, respectively, and redundant explanation will be omitted.

As illustrated in FIG. 10, a heating device 60A according to the first modification example is provided with a gas guide line 67. One end of the gas guide line 67 is connected to the second discharge opening 66 of the heating device 60A, and the other end thereof is disposed in the vicinity of the line 42 of the processing fluid supply unit 40.

A high-temperature gas discharged from the second discharge openings 66 through the branch flow path 64 is guided to the vicinity of the line 42 of the processing fluid supply unit 40 via the gas guide line 67 and then discharged from the gas guide line 67 toward the line 42. Thus, the line 42 is heated with the high-temperature gas. Since the line 42 is heated as such, in a case of using a processing liquid heated in a preset processing other than the chemical liquid processing, it is possible to suppress the temperature of the processing liquid from being decreased until the processing liquid passes through the line 42 to reach the nozzle 41. Further, even if the chemical liquid processing is started after the chemical liquid is kept from flowing through the line 42 for a long time period, it is effective in that the temperature of the chemical liquid right after starting of the chemical liquid processing can be suppressed from being decreased.

Further, the gas guide line 67 is not limited to the above-described example, and may guide the high-temperature gas discharged from the branch flow path 64 to the vicinity of a line 42 of another processing unit 16A. Thus, during the chemical liquid processing in the another processing unit 16A, it is possible to suppress the temperature of the chemical liquid from being decreased until the chemical liquid passes through the line 42 and reaches the nozzle 41.

Furthermore, the gas guide line 67 may guide the high-temperature gas discharged from the branch flow path 64 to the vicinity of a branch line 81 of another the processing unit 16A. Thus, during the chemical liquid processing in the another processing unit 16A, it is possible to heat the gas supplied from the gas source 83 before being heated by the heating unit 62. Thus, it is possible to suppress the output of the heating unit 62 from being increased.

Moreover, the gas guide line 67 may guide the high-temperature gas discharged from the branch flow path 64 to the exhaust port 52 (corresponding to an example of "exhaust line") of the processing unit 16, which is connected to the exhaust line in a factory. As such, the high-temperature gas discharged from the branch flow path 64 is directly exhausted to the outside of the chamber 20 through the exhaust port 52, and, thus, it is possible to suppress an increase in temperature within the chamber 20 caused by the high-temperature gas discharged from the branch flow path 64.

Further, in the above-described exemplary embodiment, there has been described an example where the same gas is supplied to the discharge flow path 63 and the branch flow path 64. However, a gas supplied from the discharge flow path 63 may be different from a gas supplied from the branch flow path 64.

By way of example, as illustrated in FIG. 11, in a heating device 60B according to the second modification example, the discharge flow path 63 is connected to a first gas source 87 via a line 85 and a valve 86. The first gas source 87 supplies a first gas to the discharge flow path 63 via the line 85 and the valve 86. Further, the branch flow path 64 is connected to a second gas source 90 via a line 88 and a valve 89. The second gas source 90 supplies a second gas into the branch flow path 64 via the line 88 and the valve 89.

The first gas supplied from the first gas source 87 into the discharge flow path 63 is, for example, clean dry air. The clean dry air is high-cleanliness air used in, for example, a clean room. Further, the second gas supplied from the second gas source 90 into the branch flow path 64 is, for example, compressed air. The compressed air is air used as, for example, a driving source for a pump and has a lower cleanliness than the clean dry air.

The second gas discharged toward the region other than the wafer W is not directly discharged to the wafer W. Therefore, the second gas having a lower cleanliness than the first gas may be used. Thus, it is possible to reduce the cost of the gas consumption.

Further, for example, if the chemical liquid processing in the process S102 is performed, the control unit 18 supplies the first gas supplied from the first gas source 87 to the discharge flow path 63 by closing the valve 89 and opening the valve 86. Then, after the chemical liquid processing in the process S102 is ended, the control unit 18 supplies the second gas supplied from the second gas source 90 to the branch flow path 64 by closing the valve 86 and opening the valve 89. As such, in the heating device 60B according to the second modification example, the valve 86 and the valve 89 correspond to another example of the switching unit.

If a gas supply path for the discharge flow path 63 and a gas supply path to the branch flow path 64 are separate from each other in the same manner as illustrated in the heating device 60B according to the second modification example, the gas may be continuously supplied to the branch flow path 64 in the series of substrate processings.

Further, in the above-described exemplary embodiment, there has been described an example where the heating device is disposed at the rear surface side (opposite side to the processing target surface) of the wafer W. However, the heating device may be disposed at the processing target surface side of the wafer W. This will be described with reference to FIG. 12. FIG. 12 is a diagram illustrating a configuration of the heating device according to a third modification example.

As illustrated in FIG. 12, a heating device 60C according to the third modification example is disposed at a position facing the front surface (processing target surface) of the wafer W. To be specific, the heating device 60C is disposed in a state where the sealing member 612 is disposed to face the processing target surface of the wafer W. In this case, the nozzle 41 is inserted into and passed through the circular hole (see FIG. 5 and FIG. 6) formed at the central portion of the groove-shaped member 611, the sealing member 612, and the heating unit 62.

As such, the arrangement of the heating device is not limited to the rear surface side (opposite side to the processing target surface) of the wafer W, but the heating device may be disposed at the front surface (processing target surface) of the wafer W.

Further, if the heating device is disposed at the processing target surface of the wafer W, the high-temperature gas discharged from the heating device is discharged to the chemical liquid supplied on the wafer W. Thus, the outer peripheral portion of the wafer W is indirectly heated with the high-temperature gas. On the other hand, if the heating device is disposed at the opposite side to the processing target surface of the wafer W, the high-temperature gas discharged from the heating device is directly discharged to the outer peripheral portion of the wafer W. Thus, the outer peripheral portion of the wafer W can be directly heated. Therefore, in order to efficiently heat the outer peripheral portion of the wafer W, it is desirable to dispose the heating device at the opposite side to the processing target surface of the wafer W.

Furthermore, in the above-described exemplary embodiment, there has been described an example where the etching processing is performed as the chemical liquid processing, but the chemical liquid processing is not limited to the etching processing and may be a cleaning processing in which the wafer W is cleaned by supplying a cleaning liquid such as a DHF (dilute hydrofluoric acid) onto the wafer W.

Moreover, in the above-described exemplary embodiment, there has been described an example where the gas flowing through the branch flow path 64 is discharged from the second discharge openings 66 in the opposite direction to the wafer W. However, the discharge direction of the gas flowing through the branch flow path 64 is not limited to the above-described example as long as it is not a direction toward the wafer W. By way of example, the second discharge openings 66 may be formed in a circumferential surface of the groove-shaped member 611 to discharge the gas flowing through the branch flow path 64 in a side direction of the heating device 60.

Further, the processing unit may be further provided with an elevating unit configured to elevate the heating device. In this case, during any processing other than the chemical liquid processing, i.e., at the timing of switching the gas supply destination from the discharge flow path 63 into the branch flow path 64, the heating device is moved down to be away from the wafer W, so that it is possible to more reliably suppress the outer peripheral portion WE of the wafer W from being heated during any processing other than the chemical liquid processing. Further, the processing unit may be provided with an elevating unit configured to elevate the holding unit 31 instead of the elevating unit that elevates the heating device. In this case, during any processing other than the chemical liquid processing, the holding unit 31 is moved up and the wafer W held in the holding unit 31 is away from the heating device, so that it is possible to more reliably suppress the outer peripheral portion WE of the wafer W from being heated during any processing other than the chemical liquid processing. As such, the processing unit may be provided with an elevating unit configured to relatively move the wafer W held in the holding unit with respect to the heating device.

New effects or modification examples can be easily conceived by those skilled in the art. For this reason, the invention in its broader aspects is not limited to the specific details and representative exemplary embodiment shown and described herein. Accordingly, various changes and modifications may be made without departing from the spirit or scope of the general inventive concept as defined by the appended claims and their equivalents.

Other inventive effects or modification examples may be easily conceived by those skilled in the art. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A substrate processing apparatus comprising:
   a holding unit configured to hold a substrate;
   a rotation unit configured to rotate the holding unit;
   a processing liquid supply nozzle configured to supply a processing liquid onto the substrate held in the holding unit from a position above the substrate; and
   a heating device configured to heat an outer peripheral portion of the substrate held in the holding unit, the heating device being positioned below the substrate,
   wherein the heating device includes:
   a discharge flow path through which a gas is discharged in a first direction toward the outer peripheral portion of the substrate held in the holding unit, the first direction being a direction from a position below the substrate toward the substrate;
   a branch flow path through which a gas is discharged in a second direction opposite to the first direction; and
   a heating unit configured to heat the discharge flow path and the branch flow path such that the gas is heated at the discharge flow path and at the branch flow path and is discharged in the first direction and the second direction through the discharge flow path and the branch flow path, respectively,
   wherein the heating device further includes a facing plate which is provided with the discharge flow path and the branch flow path therein and faces the substrate held in the holding unit,
   the discharge flow path communicates with at least one first discharge opening formed in a facing surface of the facing plate, which faces the substrate,
   the branch flow path communicates with a second discharge opening formed in a surface opposite to the facing surface of the heating device, and
   the second discharge opening is configured to face a side opposite to a side to which the at least one first discharge opening faces, such that the gas is discharged in opposite directions to each other.

2. The substrate processing apparatus of claim 1, further comprising:
   a switching unit configured to switch a supply destination of the gas supplied from a gas source between the discharge flow path and the branch flow path.

3. The substrate processing apparatus of claim 2, further comprising:
   a control unit configured to perform a substrate processing in which the processing liquid heated to a predetermined temperature is supplied onto the substrate by the processing liquid supply nozzle while the substrate is rotated by the rotation unit; a first discharge processing in which the gas is discharged from the discharge flow path heated by the heating unit in the first direction toward the outer peripheral portion of the substrate in at least the substrate processing; and a second discharge processing in which the gas is discharged from the branch flow path heated by the heating unit in the second direction opposite to the first direction by controlling the switching unit to switch the supply destination of the gas from the discharge flow path into the branch flow path in a predetermined processing other than the substrate processing.

4. The substrate processing apparatus of claim 3, wherein the processing liquid supply nozzle supplies the processing liquid heated to the predetermined temperature and a volatile solvent onto the substrate held in the holding unit, and
   the control unit performs the second discharge processing in a processing in which the volatile solvent is supplied onto the substrate by the processing liquid supply nozzle.

5. The substrate processing apparatus of claim 3, further comprising:
   a first flow rate control unit configured to control a flow rate of the gas flowing through the discharge flow path; and
   a second flow rate control unit configured to control a flow rate of the gas flowing through the branch flow path,
   wherein the control unit controls the first flow rate control unit and the second flow rate control unit to allow the flow rate of the gas flowing through the discharge flow path to be substantially equal to the flow rate of the gas flowing through the branch flow path.

6. The substrate processing apparatus of claim 1, wherein the at least one first discharge opening is plural in number and the discharge flow path communicates with the multiple first discharge openings, and
   the branch flow path communicates with the single second discharge opening.

7. The substrate processing apparatus of claim 6, wherein the second discharge opening has a diameter greater than the first discharge opening.

8. The substrate processing apparatus of claim 1, wherein the heating unit is provided on a surface opposite to the facing surface of the facing plate, and
   the second discharge opening is formed at the heating unit.

9. The substrate processing apparatus of claim 8, wherein the facing plate includes a groove-shaped member and a sealing member,
   the discharge flow path and the branch flow path are formed at the groove-shaped member, and
   the first discharge opening is formed at the sealing member.

10. The substrate processing apparatus of claim 1, wherein the discharge flow path discharges a first gas in the first direction toward the outer peripheral portion of the substrate held in the holding unit, and
    the branch flow path discharges a second gas having a lower cleanliness than the first gas in the second direction opposite to the first direction.

11. The substrate processing apparatus of claim 1, further comprising:

an exhaust line through which the gas discharged from the branch flow path is exhausted via a gas guide line.

12. The substrate processing apparatus of claim 1, wherein the holding unit is configured to hold a rear central portion of the substrate, and a rear surface of the substrate is exposed except the central portion held in the holding unit, and the heating device is disposed to face the exposed rear surface.

* * * * *